(12) United States Patent
LaBrake et al.

(10) Patent No.: US 7,466,892 B2
(45) Date of Patent: Dec. 16, 2008

(54) OPTICAL AND OPTOELECTRONIC ARTICLES

(75) Inventors: Dwayne L LaBrake, Cedar Park, TX (US); Brian J. Gates, Eagan, MN (US); Bryon J. Cronk, Round Rock, TX (US); Moses M. David, Woodbury, MN (US); Brian K. Nelson, Shoreview, MN (US); Michael N. Miller, Austin, TX (US); James F. Brennan, III, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/461,572

(22) Filed: Aug. 1, 2006

(65) Prior Publication Data

US 2006/0263605 A1 Nov. 23, 2006

Related U.S. Application Data

(63) Continuation of application No. 10/245,231, filed on Sep. 17, 2002, now Pat. No. 7,106,939.

(60) Provisional application No. 60/323,233, filed on Sep. 19, 2001.

(51) Int. Cl.
*G02B 6/00* (2006.01)

(52) U.S. Cl. .................... 385/141; 385/144

(58) Field of Classification Search ............ None
See application file for complete search history.

(56) References Cited

U.S. PATENT DOCUMENTS 4,660,928 A * 4/1987 Jaeger et al. ............ 385/127
5,466,431 A 11/1995 Dorfman et al.
6,136,386 A * 10/2000 Nakahigashi et al. ....... 427/536
6,696,157 B1 2/2004 David et al.
6,795,636 B1 9/2004 Cronk et al.
2004/0076393 A1* 4/2004 Singh et al. ................ 385/128

FOREIGN PATENT DOCUMENTS

EP 0743375 A2 * 11/1996
EP 0856592 A1 * 8/1998

OTHER PUBLICATIONS

Robertson, J., "Diamond-like Carbon", Pure & Appl. Chem., vol. 66, No. 9, pp. 1789-1796, 1994.*
Chapman, Brian, "Glow Discharge Processes", John Wiley & Sons, New York, 1980, pp. 153.
David et al., "Plasma Deposition and Etching of Diamond-like Carbon Films", AIChe Journal, Mar. 1991, vol. 37, No. 3, pp. 367-376.

* cited by examiner

*Primary Examiner*—Sung H Pak
(74) *Attorney, Agent, or Firm*—William F. Prout; Daniel R. Pastirik (57) ABSTRACT

Optical and optoelectronic articles incorporating an amorphous diamond-like film are disclosed. Specifically, the invention includes optical or optoelectronic articles containing an amorphous diamond-like film overlying two or more proximate substrates, and to methods of making optical and optoelectronic articles. In certain implementations, the film comprises at least about 30 atomic percent carbon, from about 0 to about 50 atomic percent silicon, and from about 0 to about 50 atomic percent oxygen on a hydrogen-free basis. Another embodiment includes optical or optoelectronic articles containing an amorphous diamond-like film that is further coated with a metallic or polymeric material for attachment to a device package.

20 Claims, 5 Drawing Sheets

OPTICAL AND OPTOELECTRONIC ARTICLES

CROSS REFERENCE TO RELATED APPLICATION

This application is a continuation of U.S. Ser. No. 10/245,231, filed Sep. 17, 2002, now U.S. Pat. No. 7,106,939; which claims priority to provisional U.S. Ser. No. 60/323,233, filed Sep. 19, 2001, the disclosure of which is incorporated by reference in its entirety herein.

TECHNICAL FIELD

The present invention relates to articles containing diamond-like films and to methods of making optical and optoelectronic articles containing diamond-like films.

BACKGROUND

Modern electronic equipment, such as optical components used in fiber optics communications, often contains numerous materials having distinct physical properties. A single optical component can contain organic polymers, glass, and metals all fused together into one article. An example of such articles is a fiber optic pigtail used to splice fiber optic components together. Each pigtail is likely to combine numerous different materials having multiple transitions between materials and interfaces where two or more materials come in contact with one another.

The transitions and interfaces in these optical components can present challenges to creating a durable, well-functioning product because they must be well sealed in order to prevent contamination from the environment (such as the entry of water or organic materials as either liquids or gases). Also they must be strong and durable, which can be a challenge because some materials do not readily bond to one another even though they are desirably placed in contact. For example, the glass used in some optical fibers does not readily bond to metals to form fiber optic packages.

Therefore, a general need exists for more durable optical components, in particular a need exits for articles that provide better protection of the transitions between materials used in optical components, as well as better adhesion at the interface between materials used in optical components.

SUMMARY OF THE INVENTION

The present invention is directed to optical articles incorporating an amorphous diamond-like film useful to protect the transitions or interfaces between the materials in an optoelectronic article. In some specific embodiments the invention includes optical and optoelectronic articles containing an amorphous diamond-like film overlying at least a portion of two or more adjacent substrates. Another embodiment includes an optical substrate having an amorphous diamond-like film on at least a portion of the substrate and at least one coating on the diamond-like film wherein a package encloses at least a portion of the diamond-like film. The invention also covers methods of making both optical and optoelectronic articles.

One embodiment of the invention is a metalized optical article incorporating an amorphous diamond-like film and a metal layer on the diamond-like film, the metal layer being useful to attach optical articles to packages to make optoelectronic articles. Specifically, the invention includes optical and optoelectronic articles containing a metalized amorphous diamond-like film overlying at least a portion of at least one substrate, and to methods of making both optical and optoelectronic articles.

Generally, the articles of the invention include an optical glass substrate and an optional polymeric substrate. When both substrates are present, the optical glass substrate can be, for example, an optical fiber, and the polymeric substrate can be a coating on a portion of the optical fiber. An amorphous diamond-like film may be deposited on at least a portion of the glass and polymeric substrates, improving the properties of the articles by forming a strong protective layer over both substrates. The diamond-like film is advantageous in that it can protect the materials on which it is deposited while providing additional sealing at the transition from the glass substrate to the polymeric substrate. The diamond-like film also provides a substrate onto which additional materials may be coated or deposited. For example, a metallic layer is deposited onto the diamond-like film in certain embodiments of the invention. Similarly, the diamond-like film can be bonded to other components by soldering, use of a glass frit, or by laser welding. In this manner it is possible to form strong, durable, hermetic seals between materials in the optical components. It is also possible to form packages that have stable, durable attachments to other components in an optoelectronic article.

Although the present invention is suitable for various articles, it is particularly well suited to use in optical and optoelectronic articles. Particularly useful optical and optoelectronic articles include, for example, fiber optic pigtails, thermal packages, optical amplifier modules, optical switch modules, dispersion compensation devices, optical multiplexer/demultiplexer units, optical receivers, and laser modules.

As used herein, the term "diamond-like film" refers to substantially or completely amorphous films containing carbon, and optionally including one or more additional components selected from the group including hydrogen, nitrogen, oxygen, fluorine, silicon, sulfur, titanium, and copper. Other elements may be present in certain embodiments. The films may be covalently bonded in a random system or in an interpenetrating system, such as in an interpenetrating diamond-like nanocomposite (called DYLYN), as described in U.S. Pat. No. 5,466,431. The amorphous diamond-like films of this invention may contain clustering of atoms that give it a short-range order, but are essentially void of medium and long range ordering that lead to micro or macro crystallinity.

Appropriate diamond-like films for use with the present invention include diamond-like carbon, diamond-like glass, diamond-like networks, and interpenetrating diamond-like nanocomposites. Generally the diamond-like film comprises at least about 25 atomic percent carbon, from about 0 to about 50 atomic percent silicon, and from about 0 to about 50 atomic percent oxygen on a hydrogen-free basis. "Hydrogen-free basis" refers to the atomic composition of a material as established by a method such as Electron Spectroscopy for Chemical Analysis (ESCA), which does not detect hydrogen even if large amounts are present in the thin films. In certain embodiments the diamond-like film comprises from about 30 to about 70 atomic percent carbon, from about 20 to about 40 atomic percent silicon, and from about 20 to about 40 atomic percent oxygen on a hydrogen-free basis. Suitable diamond-like films are typically stable at temperatures above 300° C.

As discussed above, additional coatings may be added over the diamond-like film to provide further functionality. For example, coatings of glass solder, metal or a polymeric composition can optionally be placed over the diamond-like film. Suitable metals include, for example, nickel, copper, and gold. The invention is also directed to a package enclosing at least a portion of the amorphous diamond-like film coated glass substrate, with an attaching means to adhere the package to the amorphous diamond-like film to form a hermetic seal.

The invention is further directed to a method of depositing a diamond-like film. The method includes providing a capacitively coupled reactor system having at least two electrodes in an evacuable reaction chamber. The chamber is partially evacuated, and radio frequency power is applied to one of the electrodes. A carbon-containing source is introduced between the electrodes to form a plasma including reactive species in proximity to the electrodes, and to also form an ion sheath proximate at least one electrode. An article containing two or more exposed substrates is placed within the ion sheath and exposed to the reactive species to form a diamond-like thin film over at least a portion of each of the substrates. The conditions result in a thin film that includes, for example, a diamond-like film containing on a hydrogen-free basis at least 25 atomic percent carbon, from 0 to 50 atomic percent silicon, and from 0 to 50 atomic percent oxygen. The thin film can be made to a specific thickness, typically from 1 to 10 microns, preferably 1 to 2 microns.

Optionally pre-treatment or post-treatment steps may be employed. Pre-treatment steps include cleaning the surface of a substrate before deposition. Post-treatment includes annealing the deposited film. High temperature stability of the films can be enhanced with combinations of pre-treatment and post-treatment operations.

As used herein, the term "amorphous" means a substantially randomly ordered non-crystalline material having no x-ray diffraction peaks or modest x-ray diffraction peaks.

As used herein, "glass frit" means a viscous glass-based compound, often mixed with polymers to increase melt-flow characteristics, that is used to form a fusion seal between glass-based optical elements such as an optical fiber and a substrate that often have different coefficients of thermal expansion.

As used herein, the term "bias" means that an object (e.g., an electrode) has an electrical potential with respect to some other matter (e.g., a plasma) in its vicinity.

As used herein, the term "self bias", with respect to an electrode and a plasma, means a bias developed by application of power (e.g., radio frequency) to an electrode that creates a plasma.

As used herein, the term "package" means a container or enclosure, usually having one or more opening to allow connections, such as electrical or optical connections, to other elements of a system or module.

As used herein, the term "parallel plate reactor" means a reactor containing at least two electrodes, wherein the primary mechanism for current flow between the electrodes is capacitive coupling. The electrodes may be asymmetric, meaning that they are of different size, shape, surface area, etc., and need not necessarily be parallel to each other. One electrode may be grounded, and one electrode may be the reaction chamber itself.

As used herein, the term "plasma" means a partially ionized gaseous or fluid state of matter containing reactive species that include electrons, ions, neutral molecules, free radicals, and other excited state atoms and molecules. Visible light and other radiation are typically emitted from the plasma as the species included in the plasma relax from various excited states to lower or ground states. The plasma usually appears as a colored cloud in the reaction chamber.

The above summary of the present disclosure is not intended to describe each embodiment of the present disclosure. This is the purpose of the figures and the detailed description that follow.

BRIEF DESCRIPTION OF THE DRAWINGS

Embodiments of the present invention are set forth in the following description and are shown in the drawings. Similar numerals refer to similar parts throughout the drawings.

The invention is susceptible to various modifications and alternative forms, and specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as described by the following detailed description and as defined by the appended claims.

DETAILED DESCRIPTION OF THE INVENTION

The present invention is directed to articles and methods of making the articles. In specific implementations, the articles include a glass substrate and a proximate polymeric substrate with a protective layer of a diamond-like film over a portion of the two substrates. In other implementations the articles include glass substrates with a diamond-like film over at least a portion of the substrate and a coating over the diamond-like film wherein a package encloses at least a portion of the diamond-like film.

A. Substrate Materials and Articles

Generally, the articles of the invention include an optical glass substrate and a polymeric substrate over which diamond-like film is deposited. The optical glass substrate can be, for example, an optical fiber, and the polymeric substrate can be a coating on a portion of the optical fiber. Suitable polymeric substrates include, for example, epoxy, silicone, polyimide, and acrylate.

The amorphous diamond-like film is deposited on at least a portion of the glass and polymeric substrates, improving the properties of the article by forming a strong protective layer over both substrates. The diamond-like film is advantageous in that it can protect the materials on which it is deposited while providing additional sealing at the transition from the glass substrate to the polymeric substrate. The diamond-like film deposits uniformly over surfaces having varying topography and conforms well to such surfaces. The diamond-like film also provides a substrate onto which additional materials may be coated, deposited, or adhered.

Diamond-like films may be deposited onto portions of a substrate. Parts of a substrate may be masked before diamond-like film is deposited. In this manner, the uncoated regions are more susceptible to such operations as, for example, subsequent fusion splicing or cleaving.

Figure 1A:
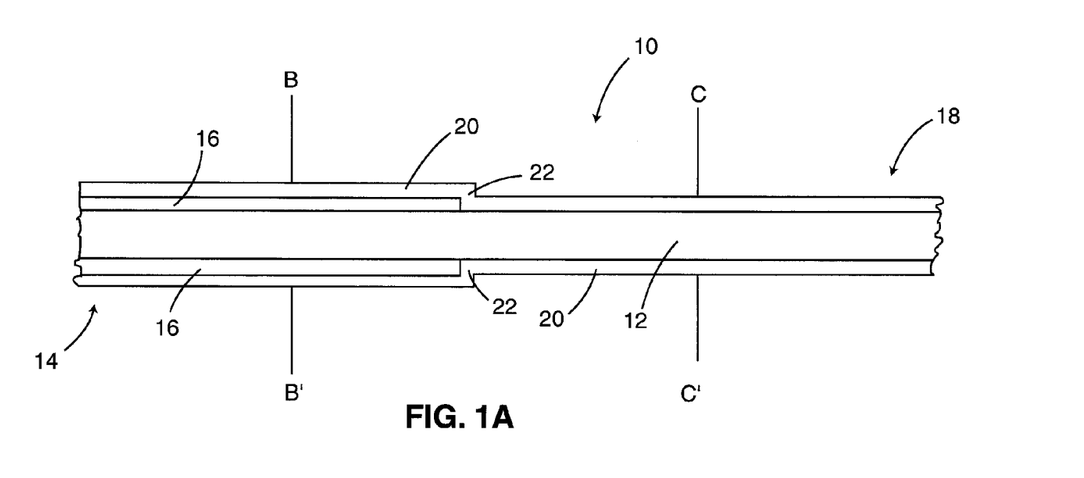
FIG. 1A is a side cross-sectional drawing of an optical fiber covered with a vapor-deposited thin film formed in accordance with an implementation of the invention.
Figure 1B:
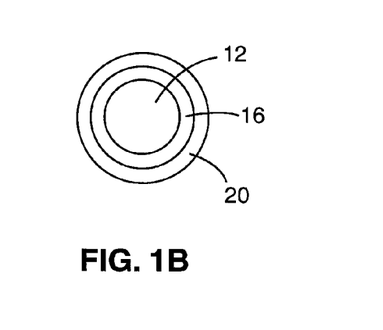
FIG. 1B is an end cross-sectional drawing of the optical fiber of FIG. 1A taken along line B-B'.
Figure 1C:
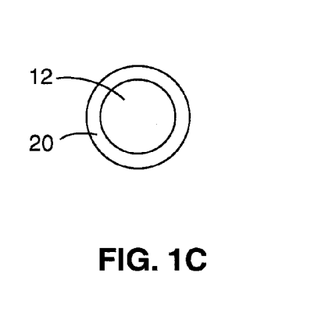
FIG. 1C is an end cross-sectional drawing of the optical fiber of FIG. 1A taken along line C-C'.

In reference now to the drawings, FIGS. 1A, 1B, and 1C illustrate cross sections of an optical fiber 10 coated with a diamond-like film in accordance with the present invention. FIG. 1A shows the optical fiber in a cross section taken along the length of the fiber, FIG. 1B shows a cross section take across the width of the fiber along plane B-B', and FIG. 1C shows a cross section take across the width of the fiber along plane C—C'. Optical fiber 10 includes an inner glass fiber 12 that is surrounded on a first end 14 with a polymeric layer 16, while the second end 18 does not have the polymeric layer. Generally the entire glass fiber 12 is initially coated with the polymeric layer 16, but part of this polymeric layer 16 is stripped from fiber 12. A diamond-like film 20 covers polymeric layer 16 and the portion of glass fiber 12 not covered by polymeric layer 16. Thus, the diamond-like film 20 is in direct contact with at least part of the fiber 12 and polymer layer 16. In particular the diamond-like film 20 covers the transition zone 22 where the polymeric layer 16 ends and the exposed (before coating with diamond-like film) fiber begins. The diamond-like film is generally about 0.01 to 100 microns thick.

The optical fiber 10 having the coating of a diamond-like film 22 is typically relatively strong and flexible, and better able to be handled and further processed, such as by being incorporated into optical packages, than an optical fiber that does not carry the diamond-like film.

Figure 2A:
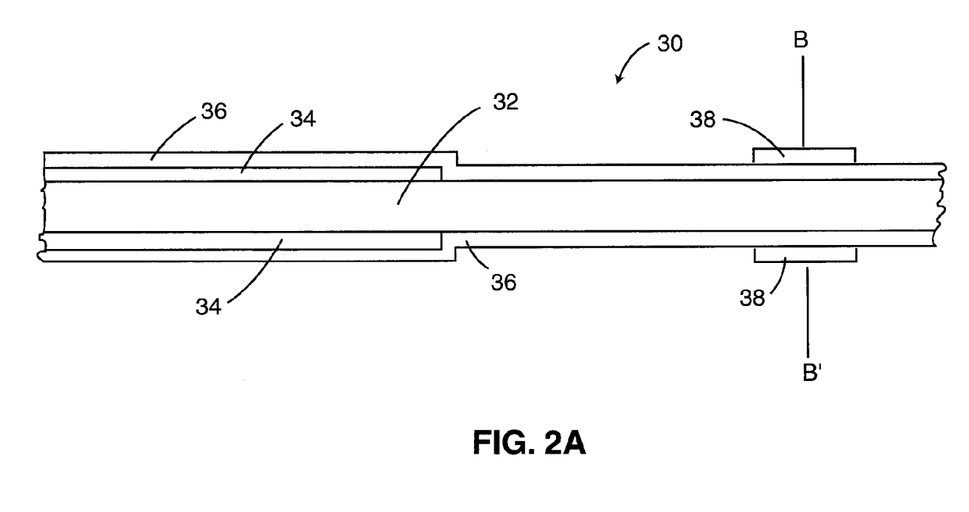
FIG. 2A is a side cross-sectional drawing of an optical fiber covered with a vapor-deposited thin film formed in accordance with an implementation of the invention.
Figure 2B:
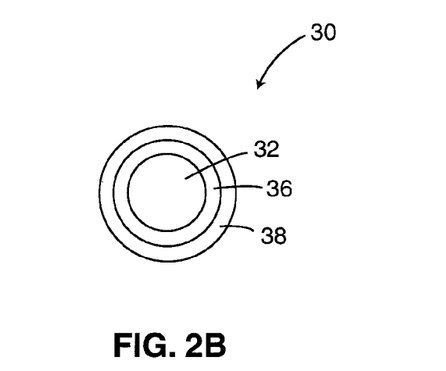
FIG. 2B is an end cross-sectional drawing of the optical fiber of FIG. 2A taken along line B-B'.

An optical fiber 30 having further enhancements is shown in FIGS. 2A and 2B, which show an optical fiber similar to the one depicted in FIGS. 1A to 1C, and which contains a glass fiber 32 partially covered by a polymeric coating 34 along with a diamond-like film 36. In addition, the fiber 32 includes a metallic layer 38 deposited on a portion of the diamond-like film 36. Metal layers can be applied by conventional deposition processes known to the art and are typically applied at temperatures of between 0° C. and 400° C. This metallic layer can be used to solder the fiber 32 to other materials, such as securing the fiber 32 into an optical package. The metal may be deposited in multiple layers, such as a first layer of nickel and a second layer of gold. Suitable metals include, for example, nickel, copper and gold. Similarly, the diamond-like film can be bonded to other components by soldering, laser welding or use of a glass frit.

Soldering conditions are often too severe for attaching polymer-coated glass to other surfaces. The solder may be glass solder or metallic solder and is applied at a temperature of between 150° C. and 450° C. Diamond-like films are durable surfaces that can withstand such temperatures.

Glass frits are typically used under conditions that are similarly severe. Glass frits are typically applied at a temperature of between 300° C. and 450° C. Laser welding involves fusing interfaces together with intense but localized heat. Interface surfaces being attached may experience temperatures of up to and over 1000° C. for times on the order of milliseconds to seconds depending on the results that are sought.

Figure 3A:
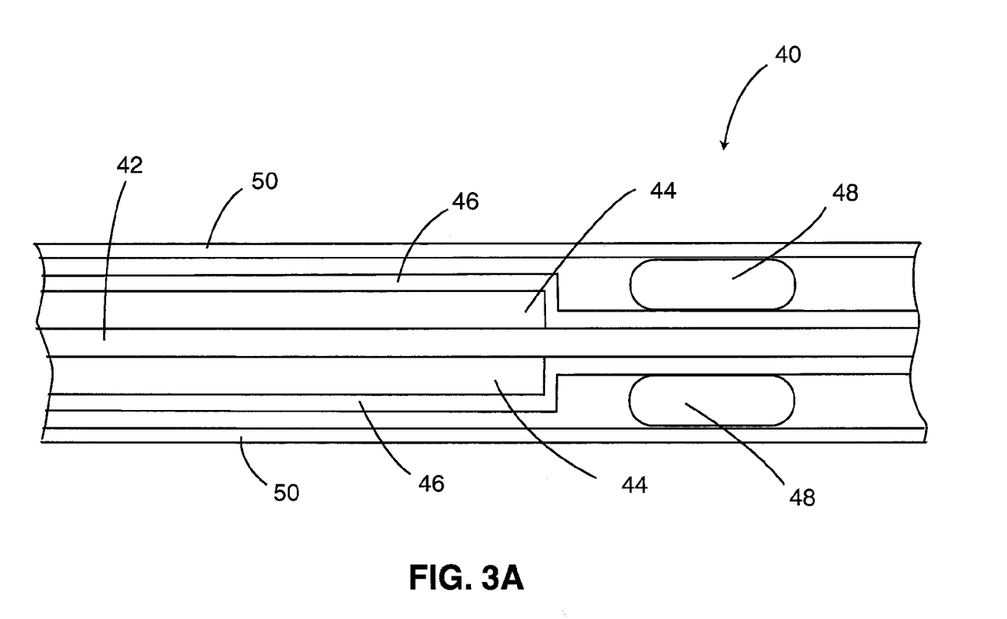
FIG. 3A is a side cross-sectional drawing of a first optical fiber package constructed and arranged in accordance with an implementation of the invention.

In reference now to FIG. 3A, an example optical package 40 constructed in accordance with the invention is shown. Optical package 40 contains an optical fiber 42 encased in part by a polymeric coating 44. Polymeric coating 44 typically includes, for example, an acrylate material. The polymer coating 44 and remainder of the optical fiber in package 40 is surrounded by diamond-like film 46. In addition, a binding material 48, such as metal, glass, or epoxy joins the diamond like film 46 to a surrounding module 50, which could be, for example, a laser module.

Figure 3B:
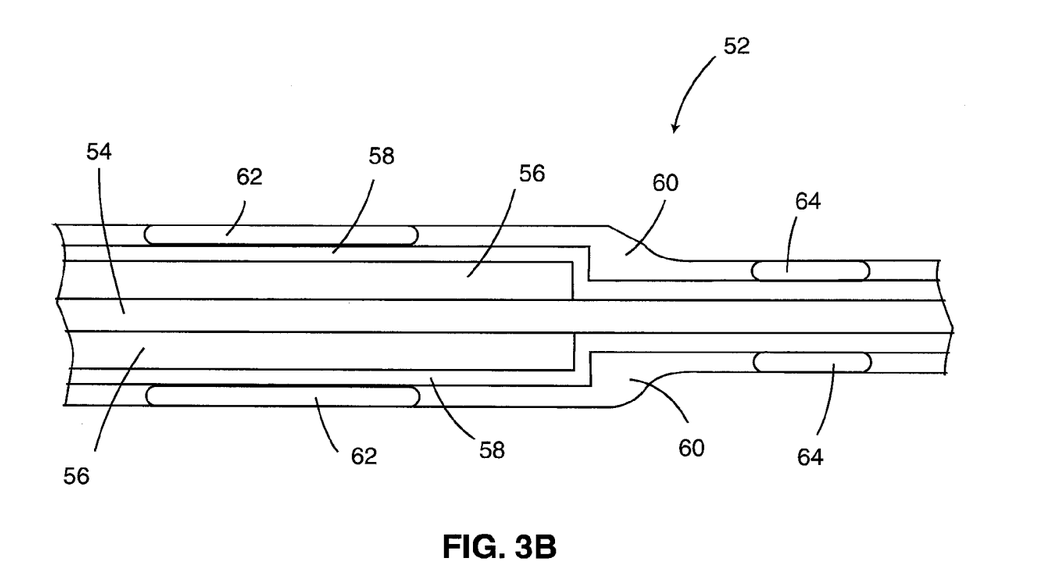
FIG. 3B is a side cross-sectional drawing of a second optical fiber package constructed and arranged in accordance with an implementation of the invention.

In reference now to FIG. 3B, an example optical package 52 constructed in accordance with the invention is shown. Optical package 52 contains a centrally located optical fiber 54, which is partially covered by a polymeric coating 56. Diamond-like film 58 encompasses polymeric coating 56 as well as portions of the optical fiber 54 that do not have polymeric coating 56. A hermetic sealing support tube 60 surrounds the diamond-like film coated fiber. A suitable support tube 60 includes, for example a glass tube. The support tube 60 of the depicted embodiment includes an adhesive 62, such an epoxy material, which provides adhesion between the diamond-like film and the support tube. A binding material 64, such as metal, glass, or epoxy, also joins the diamond-like film 58 to support tube 60.

Diamond-like film coated substrates of the invention are useful in many optical and optoelectronic articles. Optoelectronic articles may comprise optical articles that include optical fibers coated with amorphous diamond-like films and are optionally metalized. Particularly useful articles include, for example, laser modules, fiber optic pigtails, thermal packages, optical amplifier modules, optical switch modules, dispersion compensation devices, optical multiplexer/demultiplexer units, and optical receivers. The coated substrates of the invention are useful in optical packages designed for maintaining an optical device such as a laser at a constant operating temperature, or for adjusting mechanical strains to keep the optical properties of the enclosed device constant over a wide operating temperature range.

The diamond-like films of the present invention can also protect devices from detrimental environmental factors. For example, the performance of laser modules is severely degraded if the optical fibers or the enclosed lasing device materials are adversely attacked by environmental reactive species such as oxygen and water.

Forming a hermetic seal at the point where the optical fiber(s) enter or exit the laser module or other optical package protects the enclosed laser or optoelectronic device from corrosion or other chemical degradation that can shorten the operating lifetime and reduce the reliability of the enclosed optical devices. The diamond-like films applied directly to the surface of the optical fibers can provide a tight barrier against penetration of moisture and oxygen gas. Such diamond-like films can be tailored to bond tightly and hermetically to both the underlying optical fiber and the package feed-through sealing material, such as a metallic solder. The thin diamond-like films can also minimize cracking and breach of the hermetic seal due to mechanical stresses generated upon heating or cooling. Crack tendency is caused by differences in thermal expansion coefficients of the dissimilar materials that are bonded together at the seal of the optical fiber feed-through point in a hermetic package. The diamond-like films are also useful for non-hermetic seals, such as where an epoxy is used to glue the optical fiber into place at the exit of a package or device. The diamond-like film provides a moisture-resistant and scratch-resistant protective layer over the optical fiber surface, and it may provide better adhesion to both the underlying optical fiber and the epoxy than if the epoxy were applied directly to the bare optical fiber surface.

B. Diamond-Like Films

Various diamond-like films are suitable for the present invention. As the term is used herein, "diamond-like film" refers to substantially or completely amorphous films including carbon, and optionally including one or more additional components selected from the group including hydrogen, nitrogen, oxygen, fluorine, silicon, sulfur, titanium, and copper. Other elements may be present in certain embodiments. As noted above and described below, the diamond-like films include approximately 25 to 100 atomic percent carbon, with optional additional components making up the remainder (references to compositional percentages herein refer to atomic percents). The films may be random covalent interpenetrating networks. The amorphous diamond-like films of this invention can contain clustering of atoms that give a short-range order but are essentially void of medium and long range ordering that lead to micro or macro crystallinity.

Several special classes of covalently bonded diamond-like films are useful in this invention. The simplest of these are diamond-like carbon (DLC) films that include carbon and up to about 70% hydrogen, preferably about 10 to about 70%. In DLC films, hydrogen promotes diamond-like, tetrahedral bonding. Hydrogen addition increases the optical transparency of the DLC films by reducing double bonds and conjugation of double bonds in the films.

The next class of suitable diamond-like films includes diamond-like networks (DLN). In DLN, the amorphous carbon-based network is doped with other elements in addition to hydrogen. These may include fluorine, nitrogen, oxygen, silicon, copper, iodine, boron, etc. DLN generally contains at least about 25% carbon. Typically the total concentration of these one or more additional elements is low (less than about 30%) in order to preserve the diamond-like nature of the films, but may be up to about 50%.

A further class of useful diamond-like film materials is diamond-like glass (DLG), in which the amorphous carbon structure includes a substantial quantity of silicon and oxygen, as in glass, yet still retains diamond-like properties. In these films, on a hydrogen-free basis, there is at least about 30% carbon, a substantial amount of silicon (at least about 25%), and not more than about 45% oxygen. The unique combination of a fairly high amount of silicon with a significant amount of oxygen and a substantial amount of carbon make these films highly transparent but also flexible (unlike glass).

Diamond-like films suitable for the present invention typically include on a hydrogen-free basis at least about 25 atomic percent carbon, from about 0 to about 50 atomic percent silicon, and from about 0 to about 50 atomic percent oxygen. In certain implementations, the film includes from about 25 to about 70 atomic percent carbon, from about 20 to about 40 atomic percent silicon, and from about 20 to about 40 atomic percent oxygen. In another implementation, the film includes from about 30 to about 36 atomic percent carbon, from 26 to about 32 atomic percent silicon, and from about 35 to about 41 atomic percent oxygen on a hydrogen-free basis. Suitable diamond-like films are further described in co-pending application, U.S. Ser. No. 09/519,449, incorporated by reference in its entirety.

In addition, a class of interpenetrating diamond-like films is useful in this invention. These diamond-like thin films are called DYLYN and are interpenetrating systems of two materials. These interpenetrating diamond-like thin films are disclosed in, e.g., U.S. Pat. No. 5,466,431, incorporated herein by reference in its entirety.

Thin films made in accordance with the invention may have a variety of light transmissive properties. Depending upon the application, the thin films may have increased transmissive properties at various frequencies.

Diamond thin films, having significantly different properties from the diamond-like film of the present invention due to the arrangement and intermolecular bonds of carbon atoms in the specific material, have previously been deposited on substrates. The type and amount of intermolecular bonds are determined by infrared (IR) and nuclear magnetic resonance (NMR) spectra. Carbon deposits contain substantially two types of carbon-carbon bonds: trigonal graphite bonds ($sp^2$) and tetrahedral diamond bonds ($sp^3$). Diamond is composed of virtually completely of tetrahedral bonds, while diamond-like films are composed of approximately 50 to 90% tetrahedral bonds, and graphite is composed of virtually all trigonal bonds.

The crystallinity and the nature of the bonding of the carbonaceous film determine the physical and chemical properties of the deposit. Diamond is crystalline whereas the diamond-like films of the invention are a non-crystalline amorphous material, as determined by x-ray diffraction. Diamond is essentially pure carbon, whereas diamond-like film can contain a substantial amount of additional components (up to approximately 50 atomic percent for a single non-carbon component, and up to approximately 75 atomic percent for the combination of all additional non-carbon components). These atomic percents can be determined by combustion analysis.

Diamond has the highest packing density, or gram atom density (GAD) of any material at ambient pressure. Its GAD is 0.28 gram atoms/cc. Amorphous diamond-like films have a GAD ranging from about 0.20 to 0.28 gram atoms/cc. In contrast, graphite has a GAD of 0.18 gram atoms/cc. The high packing density of amorphous diamond-like film affords excellent resistance to diffusion of liquid or gaseous materials. Gram atom density is calculated from measurements of the weight and thickness of a material. "Gram atom" refers to the atomic weight of a material expressed in grams.

Amorphous diamond-like films are diamond-like because, in addition to the foregoing physical properties that are similar to diamond, they have many of the desirable performance properties of diamond such as extreme hardness (1000 to 2000 kg/mm$^2$), high electrical resistivity ($10^9$ to $10^{13}$ ohm-cm), a low coefficient of friction (0.1), and optical transparency over a wide range of wavelengths (an extinction coefficient of less than 0.1 in the 400 to 800 nanometer range).

In creating a diamond-like film, various additional components can be incorporated into the basic amorphous carbon or carbon and hydrogen system. These additional components can be used to alter and enhance the properties that the diamond-like film imparts to the substrate. For example, it may be desirable to further enhance the barrier and surface properties. The additional components may include one or more of hydrogen (if not already incorporated), nitrogen, oxygen, fluorine, silicon, sulfur, titanium, or copper. Other additional components may also work well. The addition of hydrogen promotes the formation of tetrahedral bonds. The addition of fluorine is particularly useful in enhancing barrier and surface properties of the diamond-like film, including the ability to be dispersed in an incompatible matrix. The addition of silicon and oxygen tend to improve the optical transparency and thermal stability of the diamond-like film. The addition of nitrogen may be used to enhance resistance to oxidation and to increase electrical conductivity. The addition of sulfur can enhance adhesion. The addition of titanium tends to enhance adhesion as well as diffusion and barrier properties.

Steps can be taken to make diamond-like films more stable under high temperature conditions. Diamond-like films that are thinner are generally more durable under high temperature conditions. It has been found that films having a thickness of between 1 and 2 microns were substantially more durable than films having a thickness of between 2 and 3 microns.

In addition, pre-cleaning the substrate has been found to enhance high-temperature durability of the diamond-like films. Diamond-like films have been found to be more durable if deposited on substrates that have been cleaned by pre-treatment with oxygen plasma. Moreover, diamond-like films that have been applied to glass substrates that have been pre-cleaned by exposure to an oxygen plasma for 2 minutes at a power of 2.5 kW have been found to be more durable than films on substrates pre-cleaned with an oxygen plasma for 15 seconds at a power of 1 kW.

Also, post-treatment annealing of the deposited diamond-like film has been found to enhance high temperature stability of the film. It has been found that slowly annealing the film by raising its temperature from ambient to 460° C. over 15 to 30 minutes has resulted in a film that is durable when later exposure to a temperature of 460° C. for a short time. Such temperature exposures may occur if the film is subsequently either metalized or adhered with solder or glass frit to another surface.

C. Apparatus for Forming Diamond-Like Films

Figure 4:
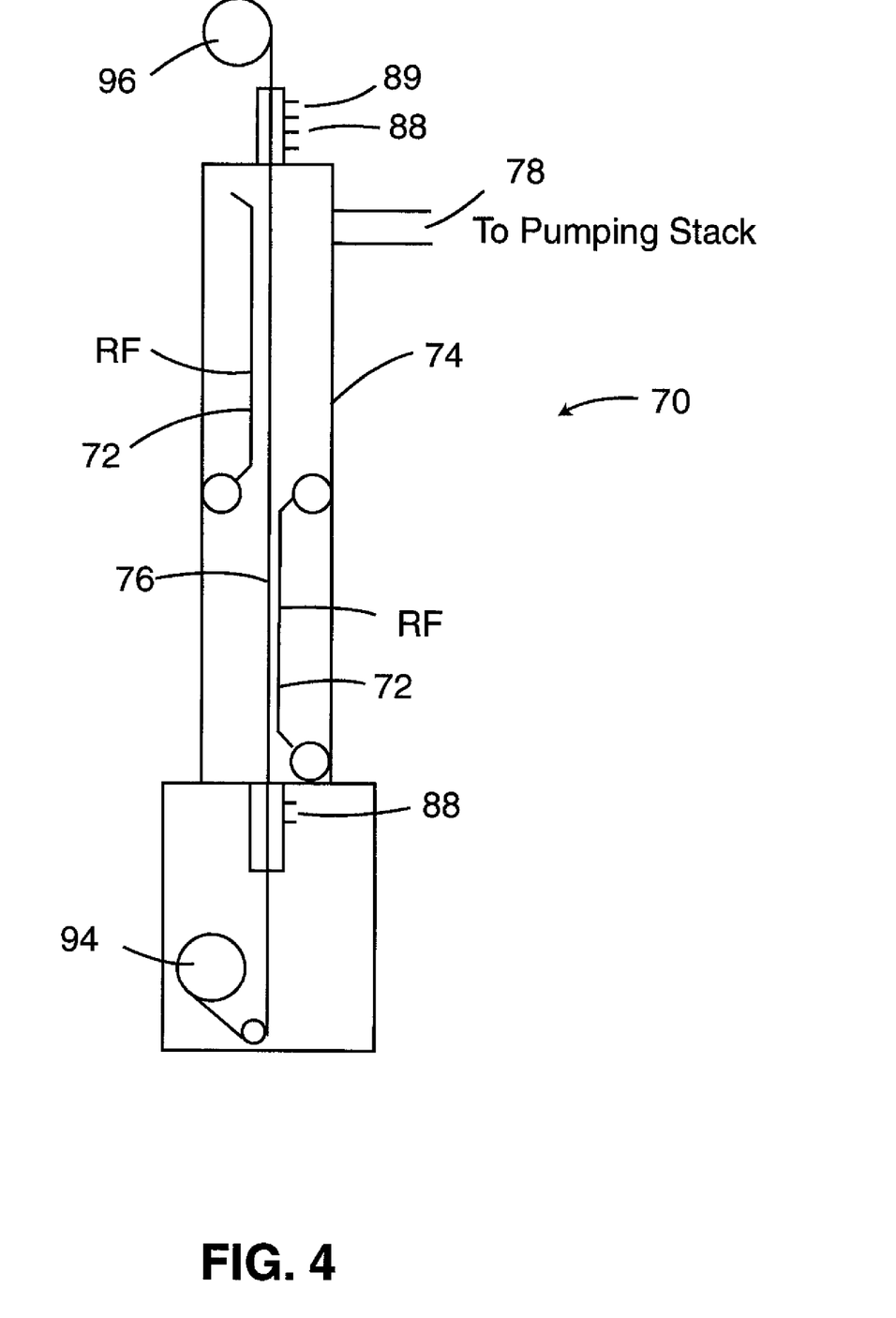
FIG. 4 is a schematic plan view of a first plasma reactor used to prepare examples of the present invention.

The figures illustrate aspects of an apparatus for preparing the diamond-like film-deposited substrates of this invention. FIG. 4 illustrates a system 70 for forming diamond-like films on one or both sides of a substrate. System 70 includes electrodes 72 one or both of which are powered by RF (typically only one electrode is powered, but both may be powered such that they are 180 degrees out of phase and have what is known in the art as a push-pull configuration) and a grounded reaction chamber 74 (that acts as a grounded electrode), which has a surface area greater than that of powered electrode(s) 72. A substrate 76 is placed proximate at least one powered electrode, an ion sheath is formed around each powered electrode, and a large electric field is established across the ion sheath.

Reaction chamber 74 is pumped to remove most air, such as by means of vacuum pumps at a pumping stack connected to chamber 74 at opening 78. Aluminum is a preferred chamber material because it has a low sputter yield, which means that very little contamination of the diamond-like film occurs from the chamber surfaces. However, other suitable materials, such as graphite, copper, glass or stainless steel, may be used.

It will be noted that chamber 74 can be any means of providing a controlled environment that is capable of evacuation, containment of gas introduced after evacuation, plasma creation from the gas, ion acceleration, and film deposition. In the embodiment shown in FIG. 4, chamber 74 has outer walls that are constructed in a manner sufficient to allow for evacuation of the chamber interior and for containment of a fluid for plasma creation, ion acceleration, and film deposition. A vacuum is maintained at the inlet and exit of the chamber by two roughing pumps (not shown), one of which is attached at location 88 and the other of which is attached at location 89.

Also, in the implementation shown, the substrate 76 is a long fiber that has a source spool 94 and a destination spool 96. In operation, substrate 76 travels from source spool 94, past the electrodes (and within an ion sheath proximate a powered electrode), and on to the destination spool 96. These spools 94, 96 are optionally enclosed within chamber 74, or can be outside chamber 74, as long as a low-pressure plasma may be maintained within the chamber. In some embodiments, such as when optical glass fibers have a diamond-like film deposited on them, the fibers are continuously drawn from a silica preform in a draw furnace then are fed into a plasma chamber where the diamond-like film is deposited.

The desired process gases are supplied from storage through an inlet tube. A stream of gas is distributed throughout the chamber. The chamber is closed and partially evacuated to the extent necessary to remove species that might contaminate the diamond-like film. The desired gas (e.g., a carbon- or hydrocarbon-containing gas) is introduced into chamber 74 at a desired flow rate, which depends on the size of the reactor and the amount of substrate in the reactor. Such flow rates must be sufficient to establish a suitable pressure at which to carry out plasma deposition, typically 0.13 Pa to 130 Pa (0.001 Torr to 1.0 Torr). For a reactor that has an inner diameter of approximately 55 cm and a height of approximately 20 cm, the flow rates are typically from about 50 to about 500 standard cubic centimeters per minute (sccm).

Plasma is generated and sustained by applying power to the gas(es) within the chamber by means of a power supply (e.g., an RF generator operating at a frequency in the range of 0.001 to 100 MHz). To obtain efficient power coupling (i.e., wherein the reflected power is a small fraction of the incident power), the impedance of the plasma load can be matched to the power supply by means of a matching network including two variable capacitors and an inductor, available from RF Power Products, Kresson, N.J., as Model # AMN 3000. A description of such networks can be found in Brian Chapman, *Glow Discharge Processes*, 153 (John Wiley & Sons, New York 1980).

The RF power source powers the electrode with a typical frequency in the range of 0.01 to 50 MHz, preferably 13.56 MHz or any whole number (e.g., 1, 2, or 3) multiple thereof. This RF power is supplied to the electrode to create a carbon-rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line. While the acceptable frequency range from the RF power source may be high enough to form a large direct current (DC) self bias on the smaller electrode, it should not be high enough to create standing waves in the resulting plasma, which is inefficient for the deposition of diamond-like film.

Upon application of RF power to the electrode, the plasma is established. In an RF-generated plasma, energy is coupled into the plasma through electrons. The plasma acts as the charge carrier between the electrodes. The plasma can fill the entire reaction chamber and is typically visible as a colored cloud. In an asymmetric configuration, higher self-bias voltage occurs across the smaller electrode. This bias is generally in the range of 100 to 2000 volts. This biasing causes ions within the carbon-rich plasma to accelerate toward the electrode thereby forming an ion sheath. The ion sheath appears as a darker area around the electrode. These accelerating ions form the carbon-rich deposit on the substrate within an ion sheath.

The depth of the ion sheath normally ranges from approximately 1 mm (or less) to 50 mm and depends on the type and concentration of gas used, pressure applied, and relative size of the electrodes (There may be one or more powered electrode and one or more grounded electrode). For example, reduced pressures will increase the size of the ion sheath as will having different sized electrodes. When the electrodes are different sizes, a larger (i.e., deeper) ion sheath will form around the smaller electrode. Generally, the larger the difference in electrode size, the larger the difference in the size of the ion sheaths. Also, increasing the voltage across the ion sheath will increase ion bombardment energy.

Preferred electrode surface area ratios between powered and grounded electrodes are from 2:1 to 4:1, and more preferably from 3:1 to 4:1. The ion sheath on the smaller electrode will increase as the ratio increases, but beyond a ratio of 4:1 little additional benefit is achieved. The reaction chamber itself can act as an electrode. A preferred configuration for this invention includes a powered electrode within a grounded reaction chamber that has two to three times the surface area of the powered electrode.

Deposition of the diamond-like film typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit.

Figure 5:
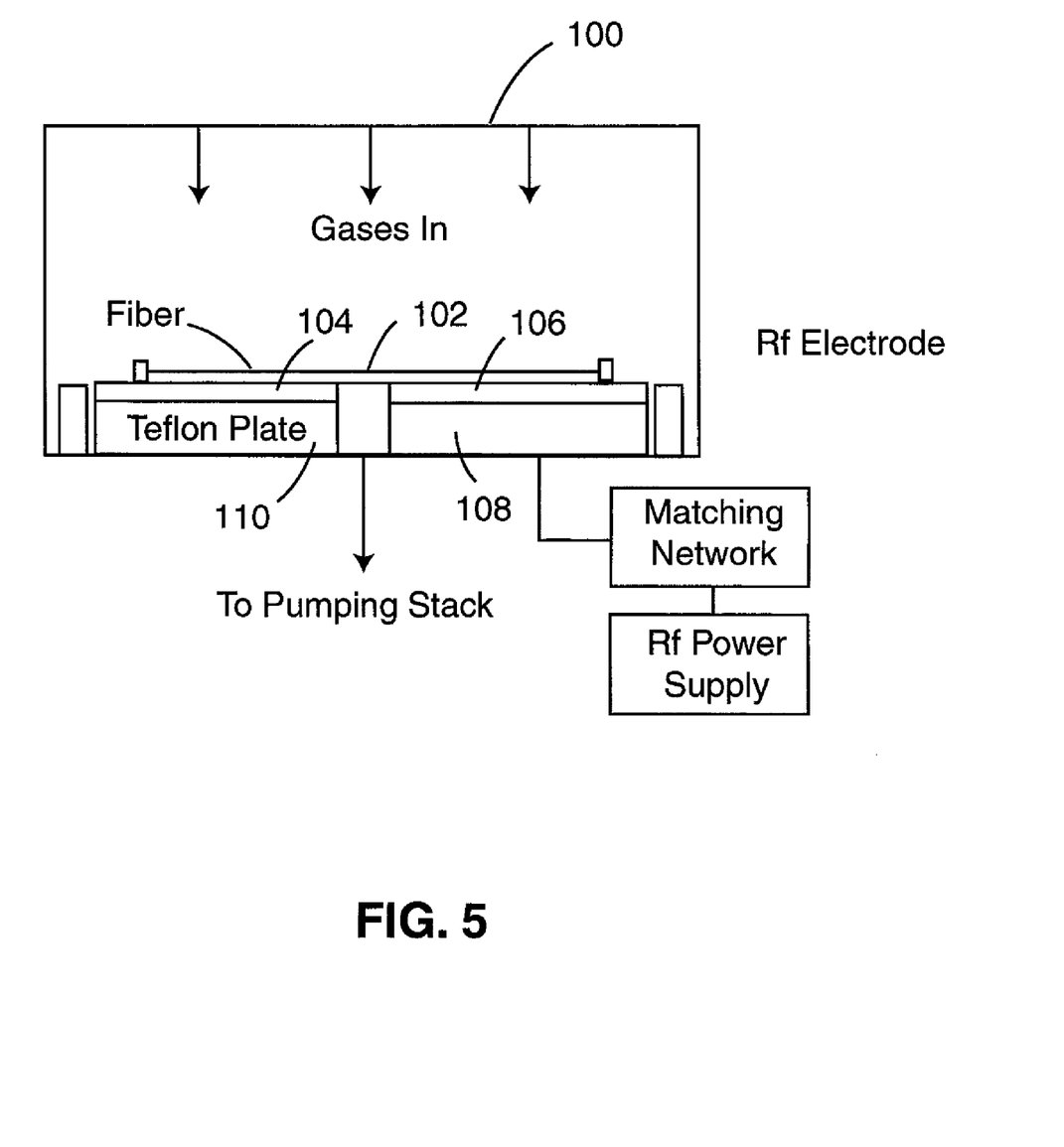
FIG. 5 is a schematic plan view of a second plasma reactor used to prepare examples of the present invention.

An alternative design for an apparatus constructed in accordance with the invention is shown in FIG. 5, showing a chamber 100 from which air is removed by a pumping stack (not shown). Replacement gases to form the plasma are injected though at least one wall of the chamber. A fiber substrate 102 is positioned proximate RF-powered electrodes 104, 106. Electrodes 104, 106 are insulated from the chamber 100 by Teflon supports 108, 110.

D. Methods of Depositing Diamond-Like Film

An aspect of the invention is further directed to a method of depositing a diamond-like film onto a substrate, including deposit of a diamond-like film onto a glass substrate. In some specific implementations, the method includes providing a capacitively coupled reactor system having two electrodes in an evacuable reaction chamber. The chamber is partially evacuated, and radio frequency power is applied to one of the electrodes. A carbon-containing source is introduced between the electrodes to form a plasma including reactive species in proximity to the electrodes, and to also form an ion sheath proximate at least one electrode. The glass substrate is exposed to the reactive species within the ion sheath that is proximate an electrode to form a diamond-like thin film on the substrate. The conditions can result in a thin film that includes a diamond-like covalent structure including on a hydrogen-free basis at least 30 atomic percent carbon, from 0 to 50 atomic percent silicon, and from 0 to 50 atomic percent oxygen.

Optionally the glass substrate is pre-cleaned by methods known to the art to remove contaminants that may interfere with the adherence of a diamond-like film. A useful pre-cleaning method is exposure of the substrate to oxygen plasma. For this method, reduced pressures of oxygen are maintained between 1.3 Pa (10 mTorr) and 27 Pa (200 mTorr). Plasma is generated with power levels of between 0.50 kW and 3.0 kW. Plasma exposure times may be up to several minutes depending on what is necessary to make the article stable for subsequent treatments or its final use. Alternatively, other gases may be used such as, for example, argon, air, nitrogen or ammonia, or mixtures thereof.

In at least one aspect of the method of this invention, diamond-like films are deposited by plasma deposition onto substrates from gases containing carbon and, in most cases, additional components. Deposition occurs at reduced pressures (relative to atmospheric pressure) and in a controlled environment. A carbon-rich plasma is created in a reaction chamber by applying an electric field to a carbon-containing gas. Substrates on which film is to be deposited are held in a vessel or container in the reactor.

Species within the plasma react on the substrate surface to form covalent bonds, resulting in an amorphous diamond-like film on the surface of the substrates. A multiplicity of substrates may be simultaneously exposed to the deposition plasma during the process of this invention. The substrates can be held in, or passed through, a vessel or container within an evacuable chamber that is capable of maintaining conditions that produce diamond-like film deposition. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, and rate of deposition of a diamond-like film from the reactive species.

Prior to the deposition process, the chamber is evacuated to the extent necessary to remove air and any impurities. Inert gases (such as argon) may be admitted into the chamber to alter pressure. Once the chamber is evacuated, a substance containing carbon (and usually hydrogen), and optionally a substance from which an additional component can be deposited, is admitted into the chamber and, upon application of an electric field, forms a plasma from which the amorphous diamond-like film is deposited. At the pressures and temperatures of diamond-like film deposition (typically 0.13 to 133 Pa (0.001 to 1.0 Torr) (all pressures stated herein are gauge pressure) and less than 50° C.), the carbon-containing substances and substances from which an optional additional component may be obtained will be in their vapor form.

For the deposition of carbon and hydrogen in a diamond-like film, hydrocarbons are particularly preferred, including acetylene, methane, butadiene, benzene, methylcyclopentadiene, pentadiene, styrene, naphthalene, and azulene. Mixtures of these hydrocarbons may also be used. Gases containing optional additional components can also be introduced into the reaction chamber. Gases with low ionization potentials, i.e., 10 eV or less, typically are used for efficient deposition of the diamond-like film.

The additional optional diamond-like film components, including one or more of hydrogen, nitrogen, oxygen, fluorine, silicon, sulfur, titanium, or copper, may be introduced in vapor form into the reaction chamber during the deposition process. Typically, even when the sources for the additional components are solids or fluids the reduced pressure in the reaction chamber will cause the source to volatilize. Alternatively, the additional components may be entrained in an inert gas stream. The additional components may be added to the chamber while a carbon- or hydrocarbon-containing gas is sustaining the plasma and/or may be added to the chamber after the flow of carbon- or hydrocarbon-containing gas has been stopped.

Sources of hydrogen include hydrocarbon gases and molecular hydrogen ($H_2$). Sources of fluorine include compounds such as carbon tetrafluoride ($CF_4$), sulfur hexafluoride ($SF_6$), perfluorobutane ($C_4F_{10}$), $C_2F_6$, $C_3F_8$, and $C_4F_{10}$. Sources of silicon include silanes such as $SiH_4$, $Si_2H_6$, tetramethylsilane, and hexamethyldisiloxane. Sources of oxygen include oxygen gas ($O_2$), hydrogen peroxide ($H_2O_2$), water ($H_2O$), and ozone ($O_3$). Sources of nitrogen include nitrogen gas ($N_2$), ammonia ($NH_3$), and hydrazine ($N_2H_6$). Sources of sulfur include sulfur hexafluoride ($SF_6$), sulfur dioxide ($SO_2$), and hydrogen sulfide ($H_2S$). Sources of copper include copper acetylacetonate. Sources of titanium include titanium halides such as titanium tetrachloride.

An ion sheath is necessary to obtain ion bombardment, which, in turn, is necessary to produce a densely-packed diamond-like film. An explanation of the formation of ion sheaths can be found in Brian Chapman, *Glow Discharge Processes*, 153 (John Wiley & Sons, New York 1980).

When two powered electrodes are used, the electrodes may be the same size or different sizes. If the electrodes are different sizes and are powered be separate sources, the smaller electrode will have a larger ion sheath. An asymmetric configuration such as this produces a higher voltage potential across the ion sheath surrounding the smaller electrode. Establishing a large ion sheath on one of the electrodes may be preferred for some embodiments of this invention because a substrate needs to be located within an ion sheath to benefit from the ion bombardment effects that occur within the sheath.

For planar substrates, deposition of dense diamond-like carbon thin films can be achieved in a parallel plate reactor by placing the substrates in direct contact with a powered electrode, which is made smaller than the grounded electrode. This allows the substrate to act as an electrode due to capacitive coupling between the powered electrode and the substrate. This is described in M. M. David, et al., *Plasma Deposition and Etching of Diamond-Like Carbon Films*, AIChE Journal, vol. 37, No. 3, p. 367 (1991), incorporated herein by reference. In the case of an elongate substrate, the substrate is optionally pulled through the vacuum chamber continuously while a continuous RF field is placed on the powered electrode and sufficient carbon-containing gas is present within the chamber. A vacuum is maintained at the inlet and exit of the chamber by two roughing pumps. The result is a continuous carbon-rich vapor-deposited thin film on an elongated substrate, and substantially only on the substrate.

Optionally, the diamond-like films may be exposed to post-treatments to anneal the films. Generally, annealing is accomplished by exposing the film to temperatures between 400° C. and 500° C. The temperature is gradually increased from ambient to an elevated temperature that is above temperatures to which the film is expected to be exposed. Annealed films are more durable under high temperature conditions typically associated with subsequent soldering or metalizing operations.

E. EXAMPLES

This invention may be illustrated by way of the following examples including the described test methods used to evaluate and characterize the diamond-like films produced in the examples.

Solder Pull Test

Metalized DLN coated fiber samples were soldered to a flat copper substrate with a gold/tin eutectic solder. Upon solidification of the solder, the soldered end was clamped in a Chatillon pull tester with the free end of the fiber wrapped around a mandrel. The samples were pulled at a rate of 12.7 mm/min (0.5 in/min) to failure. The force at the break point was recorded as the solder pull test break point.

Plasma Reactor Description

Reactor One: Diamond-like Network (DLN) films were deposited in a custom-built plasma reactor designed specifically for fiber substrates. This reactor, schematically illustrated in FIG. 4, included a vertical aluminum chamber having two linear aluminum electrodes. The electrodes were nominally 610 mm (24 inches) long and 38 mm (1.5 inches) wide, located along the linear axis of the chamber, one above the other in a staggered arrangement, i.e., were not vertically aligned. The sides and backside of the electrode were insulated with polyetherimide, available as Ultem from Union Carbide, and capped off with ground planes made of aluminum so that only the front side of the electrodes was actively exposed to the plasma. The electrodes were powered by an RF power supply (Model CX1250 from Comdel Inc., Beverly, Mass.) with matching network (Model CPM-1000 from Comdel Inc.) and controller (Model MatchPro CPM from Comdel Inc.). Tetramethylsilane (TMS) and oxygen gases were introduced into the deposition chamber through mass flow controllers (from MKS Instruments, Andover, Mass.) and pumped by a roots blower (Model EH1200 from Edwards High Vacuum, Sussex, England,) backed by a mechanical pump (Model E2M80 from Edwards High Vacuum). Pressure in the chamber was controlled by a throttle valve and controller (Models 653 and 600 series, respectively, from MKS Instruments). The fiber substrates were passed from atmospheric conditions into the chamber through differentially pumped orifice plates. Roughing pumps were used to maintain a vacuum at the entrance and exit of the vacuum chamber.

Reactor Two: A commercial parallel-plate capacitively coupled plasma reactor (commercially available as Model 2480 from PlasmaTherm of St. Petersburg, Fla.) was modified and used for subjecting DLN coated fibers to an oxygen plasma. This reactor, the cross-section of which is schematically illustrated in FIG. 5, included a grounded chamber electrode containing a powered electrode. The chamber was cylindrical in shape with an internal diameter of 762 mm (30 inches) and height of 305 mm (12 inches). A circular electrode having a diameter of 686 mm (27 inches) was mounted inside and attached to a matching network and a 3 kW RF power supply that was operated at a frequency of 13.56 MHz. The chamber was pumped by a roots blower backed by a mechanical pump. Unless otherwise stated, the base pressure in the chamber was 0.67 Pa (5 mTorr). Process gases were metered into the chamber either through mass flow controllers or a needle valve. All the plasma depositions and treatments were done with the substrate located on the powered electrode of the plasma reactor.

Metalization Apparatus: Hot plates with magnetic stirrers were used to heat and circulate plating solutions. The optical fiber ends were dipped into the plating solutions to apply the metal deposit. The electroplating was accomplished with the use of a DC power supply where the fiber was set up as the cathode and platinized niobium mesh was used as the anode.

Example 1

This example illustrates the effect of DLG thin films as packaging materials for fibers.

Ten samples were made using acrylate-coated optical fibers (comprising an optical core of Germanium-doped silica with a pure silica cladding, the optical core being the most inner portion of the glass fiber and having a higher refractive index than the pure silica so the total internal reflection can occur to allow the construction to function as an optical fiber), having nominal core diameters of 5 to 10 μm, cladding diameters of 125 μm, and acrylate coating diameters of 250 μm, (the fibers being available as Part No. CS-00-5001 from 3M Company-Optical Components Program, West Haven, Conn.). The fibers were stripped by dipping a 6 cm section of a long length of fiber sequentially into fuming sulfuric acid (at 175° C.) then water. For each sample the section of fiber was submerged in each liquid for about 30 seconds.

Plasma Reactor One was used to deposit a film on the fibers. The sectionally stripped fiber and adjacent acrylate coated fiber was mounted to a sample holder with both the stripped section and the adjacent acrylate coated section located in free-span, i.e., not making mechanical contact with any other surface. The sample holder was mounted against a powered electrode. The surface of the fiber facing away from the electrode was pre-cleaned by using an oxygen plasma at 13.3 Pa (150 mTorr) and 200 Watts for 15 seconds. After cleaning the first side, the chamber was opened, the holder was flipped over, the chamber was closed and the other side of the fiber was similarly pre-cleaned. After oxygen plasma cleaning, DLG films were deposited on the surface of the fibers by exposing each side of each fiber to a plasma for 7 minutes. The plasma was formed from a mixture of tetramethylsilane (TMS, available as a liquid from Aldrich Chemical Company, Milwaukee, Wis.) and oxygen (available in gas cylinders from Oxygen Service Company, Minneapolis, Minn.). The pressure and power were maintained at 40 Pa (300 mTorr) and 200 Watts respectively. Plasma was pulsed at a frequency of 10 Hz with a duty cycle of 90%. The flowrate of TMS and oxygen were 150 standard cubic centimeters per minute (sccm) and 100 sccm, respectively, to result in a ratio of TMS to $O_2$ of 1.5. The plasma treatment resulted in a DLG film with a target thickness of between 2 and 3 microns over the stripped portion, the acrylate coated portion and the stepwise intersection region where the acrylate coating ended.

Thickness of the DLG thin film on fibers from comparable runs was measured with an electron microscope. The thicknesses ranged from 2.0 to 5.0 microns for different process conditions, but for an individual fiber appeared uniform.

The DLG coated samples were then metalized with 2 microns of nickel followed by 0.3 microns of gold. The nickel was deposited using conventional electroless plating techniques, and the gold was applied from a commercially available immersion gold solution.

Although the DLG coating appeared uniform on examination prior to metalization, the DLG coating delaminated in localized regions after metalization when tested with the Solder Pull Test to determine a solder pull break point. This appeared to be caused by the heat that the DLG film was exposed to during the metalization process.

Example 2

This example illustrates that DLG can be made with increased high temperature durability.

DLG thin films were deposited onto Pyrex glass slides using a pre-cleaning step, a deposition step similar to that of Example 1, and a post-annealing step. Adhesive tape was placed over part of each glass slide surface to provide an uncoated surface area for deposition thickness measurement. Pre-cleaning was done with an oxygen plasma at between 8.6 and 9.3 Pa (65 and 70 mTorr) and 2599 Watts for 2 minutes with an oxygen flowrate of 100 sccm.

Deposition of a DLG thin film onto the cleaned slides was done in a manner similar to that of Example 1 except Plasma Reactor Two was used and some process conditions were changed. The flowrates of TMS and oxygen were 150 sccm and 100 sccm, respectively. The pressure and power were maintained at 40 Pa (300 mTorr) and 1500 Watts, respectively, and the cleaned glass slide was exposed to the plasma for 10 minutes. The adhesive tape was removed and the deposition thickness was determined to be about 2 microns with an Alpha-Step 500 Surface Profiler available from Tencor, Mt. View, Calif.

The coated glass slide were then post-annealed by being heated on a hot plate with the temperature increased slowly over 30 minutes to about 450° C. as determined with a thermocouple placed within a solder ball on one of the slides. The sample was then removed from the hot plate and air-cooled to room temperature.

The samples were exposed to rapid heating to evaluate the high temperature stability of the post-annealed DLG films. The samples were placed back onto a hot plate that had been preheated to 450° C. The samples reached 450° C. within seconds. Then they were removed and placed in cold water. The uncoated side of the slides cracked but the DLG layer remained intact.

Example 3

This example illustrates that a post plasma treatment can be applied.

DLG thin films were deposited onto partially stripped optical fibers as in Example 1, using Plasma Reactor One. Then the DLG film was treated with oxygen plasma in Plasma Reactor Two. The oxygen plasma was formed with an oxygen flow rate of 500 sccm and an electrode power of 2000 W in a reactor vessel with a pressure of 9.3 Pa (70 mTorr). Treatment was carried out for 75 seconds. The sample was then flipped over and treated for another 75 seconds. The metalization was performed as described in Example 1.

Example 4

This example illustrates that a hermetic package can be made by depositing a DLG film on an acid-stripped optical fiber, metallizing the DLG surface, then soldering the metallized fiber into a metal feed-through ferrule test package.

DLG was deposited on three glass fibers (during separate procedures) in a home-built tubular plasma deposition chamber comprising of a 0.5 inch (1.25 cm) diameter×60 inches (150 cm) long glass tube and two electrodes external to the glass tube. The electrodes were five feet long and were located 0.063 inches away from the chamber. The powered electrode was one inch in width and the grounded electrode was three inches in width. The fibers were acrylate-coated optical fibers having a nominal core diameter of 5-10 microns, a cladding diameter of 125 microns, and an acrylate coating diameter of 250 microns (available as Part No. CS-96-0110 from 3M Company-Optical Transport Systems, West Haven, Conn.). The fibers were stripped of acrylate in a hot sulfuric acid bath at 165° C. and subsequently translated into the vacuum chamber by Teflon idler spools where they were located at the axis of the glass tube for the DLG deposition. Prior to deposition, each glass fiber was pre-cleaned in an oxygen plasma maintained at a pressure of 38 Pa (150 mTorr) and rf power of 300 watts for two minutes. DLG was deposited by maintaining a flow of 75 sccm of tetramethylsilane and 50 sccm of oxygen. The pressure and power were maintained at 38 Pa (300 mTorr) and 80 watts, respectively. The plasma was pulsed at a frequency of 10 Hz and a duty cycle of 90% to minimize powder formation. The DLG deposition time was six minutes.

One of the DLG-coated fibers was annealed in a fiber annealing chamber by ramping temperature at the rate of 400° C./hr from room temperature to 400° C. and back down to room temperature.

The metallization of the DLG coated fibers was performed by depositing electroless nickel directly on the DLG coating from a commercially available electroless nickel solution. The nickel was plated to a thickness of 0.3 µm. Following electroless nickel plating, the metallized fiber was further metallized with 2.0 μm of electrolytic nickel at a current density of 10 amps/square foot (ASF) (107.6 amps/m²). Following nickel plating, the fiber was metallized with 3.0 μm of electrolytic gold at a current density of 6 ASF (64.6 amps/m²).

Each metallized DLG coated fiber was soldered into a gold plated ferrule made of KOVAR (a vacuum melted, Fe—Ni—Co, low expansion alloy, available from Carpenter Technology Corporation, Wyomissing, Pa.) using Gold-Tin eutectic solder (Au80/Sn20). The soldering was performed by resistive heating of the KOVAR ferrule to a temperature of 300-350° C. for a period of 3 seconds. During this period, 30 mil (762 micron) diameter Gold-Tin solder wire was contacted against the inside wall of the KOVAR tube to fill the volume between the metallized fiber and the gold plated KOVAR tube. To prevent oxidation of the solder and the gold plated ferrule during soldering, nitrogen gas was used to blanket the soldered region at a flow rate of 8 standard cubic feet/hour ($6.29 \times 10^{-5}$ meters³/sec).

The hermeticity of the soldered fiber/ferrule packages was tested using a Helium Leak detector, available from Varian, Palo Alto, Calif. A custom fixture comprising a compressible O-ring gasket was used to create a seal around the KOVAR ferrule. As the vacuum pressure of the leak detector stabilized, the soldered region of the KOVAR ferrule was flooded with helium and the leak rate was measured. The leak rate was less than $1 \times 10^{-9}$ atm cc/sec He for each of the three samples prepared. Typical leak rates of hermetic packages are on the order of $1 \times 10^{-8}$ atm cc/sec He.

Having now described the features, discoveries and principles of the invention, the manner in which the process and apparatus is constructed and used, the characteristics of the construction, and the advantageous, new and useful results obtained, the new and useful structures, devices, elements, arrangements, parts, and combinations are set forth in the appended claims.

We claim:

1. An optical or optoelectronic article comprising:
    an optical glass substrate;
    a polymeric substrate proximate the optical glass substrate and covering a first portion of the optical glass substrate; and
    an amorphous diamond-like glass film deposited on at least a second portion of the glass substrate and on all of the polymeric substrate, wherein the amorphous diamond-like glass film covers both the second portion of the glass substrate and all of the polymeric substrate, and wherein-the amorphous diamond-like glass film includes a substantial quantity of silicon and oxygen, yet still retains diamond-like properties.

2. The article of claim 1, wherein the diamond-like glass film comprises from about 30 to about 70 atomic percent carbon, from about 25 to about 40 atomic percent silicon, and from about 20 to about 40 atomic percent oxygen on a hydrogen-free basis.

3. The article of claim 1, wherein the diamond-like glass film has an average thickness from about 0.01 to about 100 microns.

4. The article of claim 1, wherein the glass substrate is a waveguide.

5. The article of claim 4, wherein the waveguide is an optical fiber.

6. The article of claim 1, wherein the diamond-like glass film provides a hermetic seal between the glass substrate and the polymeric substrate.

7. The article of claim 1, wherein the diamond-like glass film is stable at temperatures above 300° C.

8. The article of claim 1, further comprising at least one coating on the diamond-like glass film.

9. The article of claim 8, wherein the outermost coating is glass solder, metal, or a polymeric composition.

10. The article of claim 9, wherein the metal comprises a first layer of nickel and a second layer of gold.

11. The article of claim 1, wherein the polymeric substrate is selected from the group comprising epoxy, silicone, polyimide, acrylate, fluorinated polymer, and combinations thereof.

12. The article of claim 1, wherein the article is selected from the group comprising a laser module, an optical amplifier module, a fiber optic pigtail, a thermal package, an optical amplifier module, a optical switch module, a dispersion compensation device, an optical multiplexer/demultiplexer unit, or an optical receiver.

13. The article of claim 1, further comprising:
    a coating deposited on at least a portion of the amorphous diamond-like glass film; and
    a package enclosing at least a portion of the amorphous diamond-like glass film.

14. The optical article of claim 13, further comprising an attaching means to adhere the package to the amorphous diamond-like glass film.

15. The optical article of claim 13, where the coating is metallic or polymeric.

16. The optical article of claim 14, wherein the attaching means is solder, glass flit, or a laser weld.

17. An optical or optoelectronic article comprising:
    an optical glass substrate;
    a polymeric substrate proximate the optical glass substrate and covering a first portion of the optical glass substrate; and
    an amorphous diamond-like glass film deposited on at least a second portion of the glass substrate and on all of the polymeric substrate, wherein the amorphous diamond-like film includes a substantial quantity of silicon and oxygen, yet still retains diamond-like properties, the amorphous diamond-like glass film covers both the second portion of the glass substrate and all of the polymeric substrate, and the glass substrate is a waveguide.

18. An optical article comprising:
    an optical glass substrate;
    an amorphous diamond-like glass film deposited on at least a portion of the glass substrate, wherein the diamond-like glass film includes a substantial quantity of silicon and oxygen, as in glass, yet still retains diamond-like properties;
    at least one coating on the diamond-like glass film; and
    a package enclosing at least a portion of the amorphous diamond-like glass film.

19. The article of claim 3, wherein the diamond-like glass film has an average thickness from about 1 to about 10 microns.

20. The article of claim 19, wherein the diamond-like glass film has an average thickness from about 1 to about 2 microns.

* * * * *

UNITED STATES PATENT AND TRADEMARK OFFICE
CERTIFICATE OF CORRECTION

PATENT NO. : 7,466,892 B2　　　　　　　　　　　　　　　　　　　　　　　Page 1 of 1
APPLICATION NO. : 11/461572
DATED : December 16, 2008
INVENTOR(S) : Dwayne L. Labrake It is certified that error appears in the above-identified patent and that said Letters Patent is hereby corrected as shown below:

Column 5
Line 19, delete "C—C'" and insert -- C-C' --, therefor.

Column 17
Line 48, in Claim 1, delete "wherein-the" and insert -- wherein the --, therefor.

Column 18
Line 33, in Claim 16, delete "flit" and insert -- frit --, therefor.

Signed and Sealed this

Seventeenth Day of March, 2009

JOHN DOLL
*Acting Director of the United States Patent and Trademark Office*